United States Patent
Kaneko (10) Patent No.: US 11,841,385 B2
(45) Date of Patent: Dec. 12, 2023

(54) DIAGNOSTIC METHOD AND DIAGNOSTIC DEVICE OF THREE-PHASE ALTERNATING CURRENT MOTOR

(71) Applicant: Nissan Motor Co., Ltd., Yokohama (JP)

(72) Inventor: Yuta Kaneko, Kanagawa (JP)

(73) Assignee: Nissan Motor Co., Ltd., Yokohama (JP)

( * ) Notice: Subject to any disclaimer, the term of this patent is extended or adjusted under 35 U.S.C. 154(b) by 0 days.

(21) Appl. No.: 17/632,469

(22) PCT Filed: Jan. 14, 2021

(86) PCT No.: PCT/JP2021/001098
§ 371 (c)(1),
(2) Date: Feb. 2, 2022

(87) PCT Pub. No.: WO2022/153453
PCT Pub. Date: Jul. 21, 2022

(65) Prior Publication Data
US 2023/0160932 A1    May 25, 2023

(51) Int. Cl.
*G01R 19/00* (2006.01)
*G01R 31/34* (2020.01)
*H02P 29/024* (2016.01)

(52) U.S. Cl.
CPC ......... *G01R 19/0092* (2013.01); *G01R 31/34* (2013.01); *H02P 29/024* (2013.01)

(58) Field of Classification Search
CPC .. G01R 19/0092; G01R 31/34; G01R 31/343; H02P 29/024

USPC ........................ 318/139, 400.15, 400.01, 700
See application file for complete search history.

(56) References Cited

U.S. PATENT DOCUMENTS

| 9,787,240 B2 * | 10/2017 | Koseki .................. B62D 3/123 |
| 11,005,405 B2 | 5/2021 | Furukawa et al. |
| 2019/0267925 A1 | 8/2019 | Furukawa et al. |

FOREIGN PATENT DOCUMENTS

| JP | 2001-218499 A | 8/2001 |
| JP | 2019-140724 A | 8/2019 |
| WO | 2018/092210 A1 | 5/2018 |

* cited by examiner

*Primary Examiner* — David Luo
(74) *Attorney, Agent, or Firm* — Young Basile Hanlon & MacFarlane, P.C.

(57) ABSTRACT

A diagnostic method of a three-phase AC motor including: applying predetermined voltage in an order of first, second, and third current paths among three current paths in which current flows from a first phase winding to a second phase winding, from the second phase winding to a third phase winding, from the third phase winding to the first phase winding, respectively, via a neutral point; and detecting an abnormality based on current values flowing in these paths, wherein the second current path is a path in which a rate of change of generated torque to change of the rotation angle at a current rotation angle of the motor is greatest among the three paths, and a rotation direction of the motor when the first current path is energized is a direction in which an absolute value of torque generated when starting energization of the second current path decreases.

8 Claims, 6 Drawing Sheets

DIAGNOSTIC METHOD AND DIAGNOSTIC DEVICE OF THREE-PHASE ALTERNATING CURRENT MOTOR

TECHNICAL FIELD

The present invention relates to a diagnostic method and a diagnostic device of a three-phase alternating current motor.

BACKGROUND

The following JP 2001-218499 describes a method of determining an abnormality by applying inspection current for abnormality detection to a winding of a three-phase alternating current motor to determine whether a resistance value of a winding of each phase is normal or not.

SUMMARY

A resistance value of each phase winding of a three-phase alternating current motor can be calculated by a current value and a voltage value between terminals when current for resistance detection is applied to any two of the three phase windings, respectively. In other words, calculation can be performed by using a current value and a voltage value of a winding when current for resistance detection is applied to a first phase (U-phase, for example) winding and a second phase (V-phase, for example) winding, the second phase winding and a third phase winding (W-phase, for example) and the third phase winding and the first phase winding, respectively, for example.

However, when current is applied only to any two phase windings of three phase windings, the three-phase alternating current motor may move significantly because vector control is not possible. Therefore, a user may experience discomfort when the three-phase alternating current motor moves significantly by applying the current for resistance detection to a stopped three-phase alternating current motor.

The purpose of the present disclosure is to suppress a rotation of the three-phase alternating current motor when diagnosing the three-phase alternating current motor by applying current to the first phase winding and the second phase winding, the second phase winding and the third phase winding, or the third phase winding and the first phase winding of the three-phase alternating current motor.

According to an embodiment of the present invention, there is provided a diagnostic method of a three-phase alternating current motor having a first phase winding, a second phase winding and a third phase winding. The diagnostic method includes applying predetermined voltage for a predetermined period of time in an order of a first current path, a second current path, and a third current path among the three current paths of a current path in which the current flows from the first phase winding to the second phase winding via a neutral point, a current path in which the current flows from the second phase winding to the third phase winding via a neutral point, and a current path in which the current flows from the third phase winding to the first phase winding via a neutral point, and detecting an abnormality in the first phase winding, the second phase winding, and the third phase winding based on the current values flowing in the first current path, the second current path, and the third current path when the predetermined voltage is applied.

The second current path is a current path in which a rate of change of generated torque with respect to change of the rotation angle at a current rotation angle of the three-phase alternating current motor is greatest among the three current paths, and a rotation direction of the three-phase alternating current motor when the first current path is energized is a direction in which an absolute value of generated torque generated when stating energization of the second current path decreases.

According to the aspect of the present invention, it is possible to suppress a rotation of the three-phase alternating current motor when diagnosing the three-phase alternating current motor by applying current to the first phase winding and the second phase winding, the second phase winding and the third phase winding, or the third phase winding and the first phase winding of the three-phase alternating current motor.

The object and advantages of the invention will be realized and attained by means of the elements and combinations particularly pointed out in the claims. It is to be understood that both the foregoing general description and the following detailed description are exemplary and explanatory and are not restrictive of the invention.

DETAILED DESCRIPTION

Figure 1:
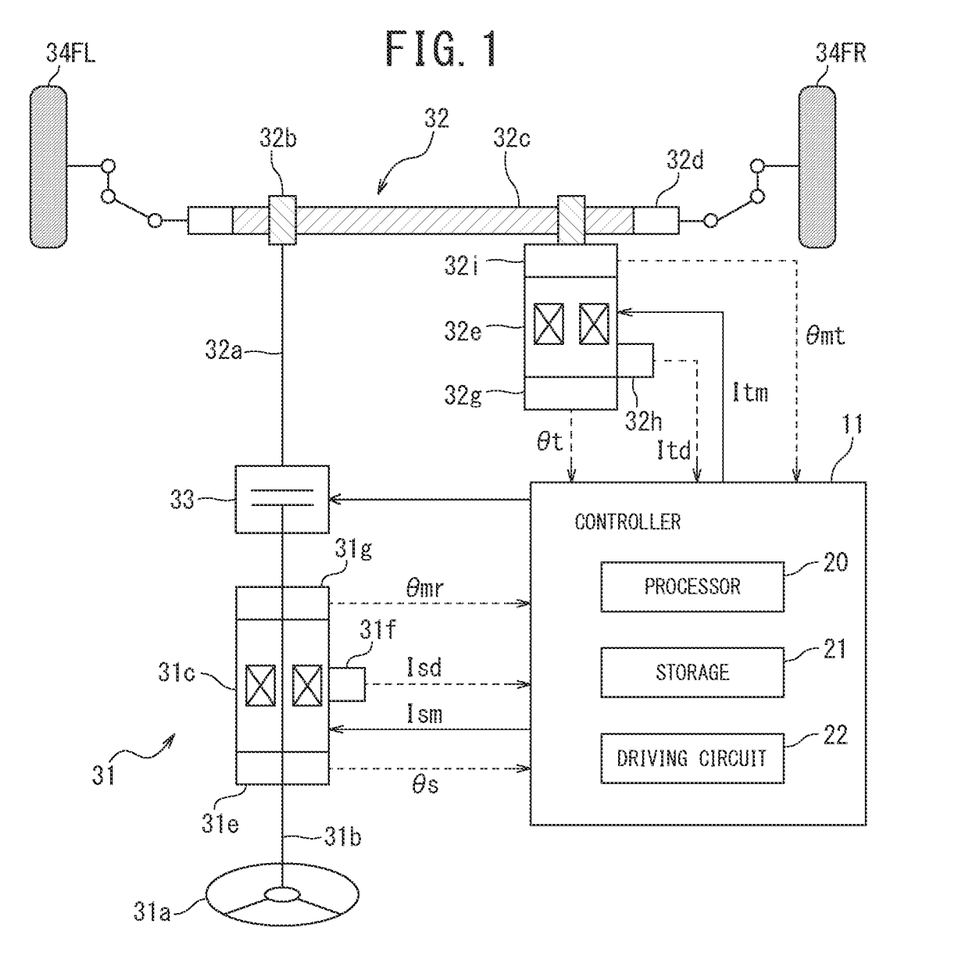
FIG. 1 is a schematic configuration diagram of an exemplary steering device according to an embodiment.

FIG. 1 is a schematic configuration diagram of an exemplary steering device according to an embodiment mounted on a vehicle.

The steering device according to the embodiment includes a steering unit 31 for accepting a steering input from a driver, a turning unit 32 for turning left and right front wheels 34FL and 34FR being the steered wheels, a backup clutch 33, and a controller 11.

The steering device adopts a steer-by-wire (SBW) system in which the steering unit 31 and the turning unit 32 are mechanically separated when the backup clutch 33 is released. In the description below, the left and right front wheels 34FL and 34 FR may be referred to as "steered wheels 34".

The steering wheel 31a of the steering unit 31 is subjected to steering reaction force torque by the reaction force motor 31c and rotates in response to steering torque input by a driver.

The reaction force motor 31c is a three-phase alternating current motor and includes a rotation shaft (output shaft) coaxially arranged with the column shaft 31b and integrally rotates with the steering wheel 31a. The reaction force motor 31c is driven by reaction force current Ism output from the controller 11 and outputs rotation torque to be applied to the steering wheel 31a to the column shaft 31b. By applying rotation torque, steering reaction force torque is applied to the steering wheel 31a.

The steering angle sensor 31e detects a rotation angle of the column shaft, in other words, a steering angle θs (steering wheel angle) of the steering wheel 31a. The current sensor 31f detects reaction force current being the driving current of the reaction force motor 31c and inputs to the controller 11 as detected reaction force current Isd. The motor rotation angle sensor 31g detects a rotation angle θmr of the rotation shaft of the reaction force motor 31c and inputs to the controller 11. For example, the motor rotation angle sensor 31g detects an electric angle of the rotation shaft of the reaction force motor 31c as the rotation angle θmr.

Meanwhile, the steering gear 32b of the turning unit 32 engages with the rack gear 32c and turns the steered wheels 34 in accordance with the rotation of the pinion shaft 32a. A rack-and-pinion type steering gear or the like may be adopted as the steering gear 32b, for example. The backup clutch 33 is arranged between the column shaft 31b and the pinion shaft 32a. When the backup clutch 33 is released, the steering unit 31 and the turning unit 32 are mechanically detached, and when engaged, the steering unit 31 and the turning unit 32 are mechanically connected. The backup clutch 33 is released when no abnormalities have occurred in the steer-by-wire system, and the backup clutch 33 is also released when performing a diagnostic process described below.

The turning motor 32e is driven by turning current Itm output from the controller 11, and outputs turning torque for turning the steered wheels 34 to the steering rack 32d. The turning motor 32e includes an output shaft coupled to the rack gear 32c via a reduction gear. The turning angle sensor 32g detects an actual turning angle θt being the actual turning angle of the steered wheels 34.

The current sensor 32h detects turning current being the driving current of the turning motor 32e, and inputs to the controller 11 as detected turning current Itd. The motor rotation angle sensor 32i detects a rotation angle θmt of the rotation shaft of the turning motor 32e and inputs the detected value of the rotation angle θmt to the controller 11.

The controller 11 is an Electronic Control Unit (ECU) for controlling the steering reaction force torque applied to the steering wheel 31a by the reaction force motor 31c, and for controlling the turning of the steered wheels.

The controller 11 includes a processor 20, a storage 21, a driving circuit 22, and the like.

The processor 20 may be a Central Processing Unit (CPU), a Micro-Processing Unit (MPU), or the like. The storage 21 may include a semiconductor storage, a magnetic storage, and an optical storage. The storage 21 may include a register, a cache memory, and a memory used as a main storage.

The information processing described below executed by the controller 11 may be achieved by the processor 20 executing a computer program stored in the storage 21 of the controller 11, for example. The information processing described below executed by the controller 11 may be performed by a functional logic circuit set up in a general-purpose semiconductor integrated circuit. For example, the controller 11 may include a Programmable Logic Device or the like such as a Field-Programmable Gate Array.

The controller 11 further includes a driving circuit 22 for generating the reaction force current Ism for driving the reaction force motor 31c and the turning current Itm for driving the turning motor 32e. The driving circuit 22 may include a switching element for controlling the reaction force current Ism and the turning current Itm, for example.

The controller 11 calculates a steering reaction force command value corresponding to the actual turning angle θt. The controller 11 calculates the steering reaction force command value which becomes greater when the actual turning angle θt is greater as the steering reaction force command value simulating self-aligning torque generates in response to the actual turning angle θt, for example. The controller 11 outputs the reaction force current for generating the steering reaction force torque in accordance with the steering reaction force command value to the reaction force motor 31c, and applies the steering reaction force torque to the steering wheel 31a.

The controller 11 calculates a target turning angle of the steered wheels 34 in accordance with the steering angle θs. The controller 11 turns the steered wheels 34 by outputting the turning current Itm for generating the turning torque in accordance with the turning force command value to the turning force motor 32e.

The controller 11 performs the diagnostic process for determining whether an abnormality has occurred in the three phase windings of the reaction force motor 31c. In the diagnostic process, the controller 11 applies (flows) diagnosing current to the three phase windings, and measures the resistance values of the three phase windings based on the current flowing in the phase windings and the applied voltage. The controller 11 determines whether an abnormality such as a temperature abnormality, disconnection or a short circuit has occurred in the three phase windings or not based on the measured resistance values. For example, the controller 11 may perform the diagnostic process of the reaction force motor 31c immediately after an ignition switch has changed from an off state to an on state. Alternatively, the controller 11 may perform the diagnostic process periodically while the ignition switch is in the on state.

Figure 2A:
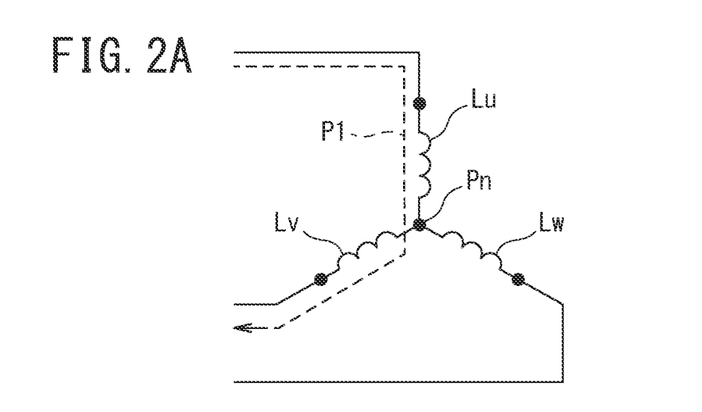
FIGS. 2A to 2C are explanatory diagrams of current paths for applying current for applying diagnosing current.
Figure 2B:
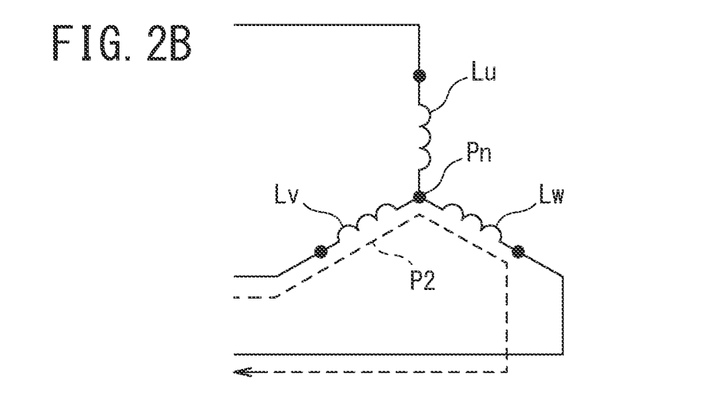
Figure 2C:
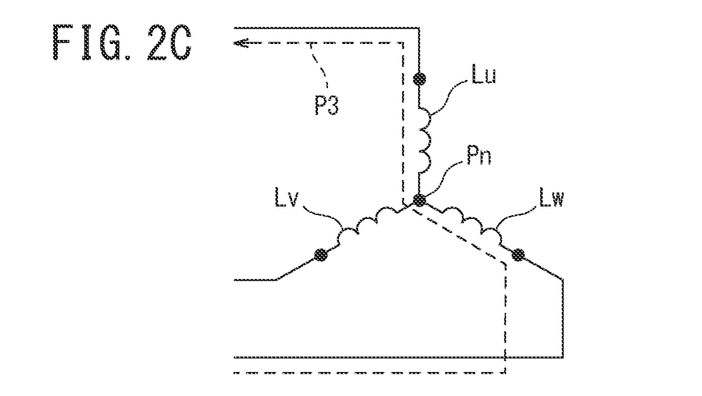

Refer to FIGS. 2A to 2C. The reaction force motor 31c includes three windings of a U-phase winding Lu, a V-phase winding Lv, and a W-phase winding Lw. In the diagnostic process, the controller 11 applies diagnosing current to the current paths P1, P2, and P3 illustrated in the diagram.

The current path P1 is a current path in which the diagnosing current flows from the U-phase winding Lu to the V-phase winding Lv via the neutral point Pn without flowing through the W-phase winding Lw, the current path P2 is a current path in which the diagnosing current flows from the V-phase winding Lv to the W-phase winding Lw via the neutral point Pn without flowing through the U-phase winding Lu, and the current path P3 is a current path in which the diagnosing current flows from the W-phase winding Lw to the U-phase winding Lu via the neutral point Pn without flowing through the V-phase winding Lv. The controller 11 applies the diagnosing current to the current paths P1 to P3 by applying predetermined voltage (power voltage Vb for example) for a predetermined period of time.

The simultaneous equations (1) to (3) are established when the current values of the diagnosing current flowing in the current paths P1 to P3 are I1 to I3, the resistance values of the U-phase winding Lu, the V-phase winding Lv, and the W-phase winding Lw are Ru, Rv and Rw, the U-phase terminal voltage, the V-phase terminal voltage, and the W-phase terminal voltage are Vu, Vv, and Vw.

$$I1(Ru+Rv)=Vu-Vv \quad (1)$$

$$I2(Rv+Rw)=Vv-Vw \quad (2)$$

$$I3(Ru+Rw)=Vw-Vu \quad (3)$$

The controller 11 measures the resistance values Ru, Rv and Rw by solving the simultaneous equations (1) to (3).

As described above, when the current is applied only to any two phase windings of three phase windings, the reaction force motor 31c may rotate significantly because of the diagnosing current since vector control is not possible. Therefore, when the reaction force motor 31c rotates significantly when the user is not moving the steering wheel 31a, the user may experience discomfort.

Here, the amount of change in the rotation angle θmr of the reaction force motor 31c is proportional to the time integral of the generated torque generated in the reaction force motor 31c by the energization, and the generated torque depends on the rotation angle θmr of the reaction force motor 31c.

Therefore, the controller 11 suppresses the amount of rotation by reducing the integral amount of the generated torque in the reaction force motor 31c due to the diagnosing current by setting the order of applying the diagnosing current to each of the current paths P1 to P3 according to the rotation angle θmr of the reaction force motor 31c.

For example, since the rotation angle θmr of the reaction force motor 31c increases or decreases when the diagnosing current flows sequentially in the current paths P1 to P3, the difference (amplitude) between the maximum value and the minimum value of the rotation angle θmr of the reaction force motor 31c is suppressed.

Therefore, the controller 11 applies the diagnosing current in the second place to a current path among the current paths P1 to P3 with the highest rate of change of the generated torque with respect to the change in the rotation angle at the current rotation angle θmr.

Hereinafter, a current path to which the diagnosing current is applied in the second place may be referred to as a "second current path". A current path to which the diagnosing current is applied earlier than the second current path may be referred to as a "first current path". A current path to which the diagnosing current is applied later than the second current path may be referred to as a "third current path".

By applying the diagnosing current to the first current path, the controller 11 rotates the reaction force motor 31c in a direction in which the generated torque reduces when the second current path is energized. As described above, the second current path is selected in a way that the rate of change of the generated torque with respect to the rotation angle change is the largest among the three current paths P1 to P3.

Therefore, by applying the diagnosing current to the first current path to rotate the reaction force motor 31c in a direction in which the absolute value of the generated torque generated when the second current path is energized subsequently decreases, the generated torque generated when the diagnosing current is applied in the second place can be reduced the most. As a result, the total of the integral value of the generated torque when the diagnosing current is applied to each of the current paths P1 to P3 can be efficiently suppressed.

Figure 3:
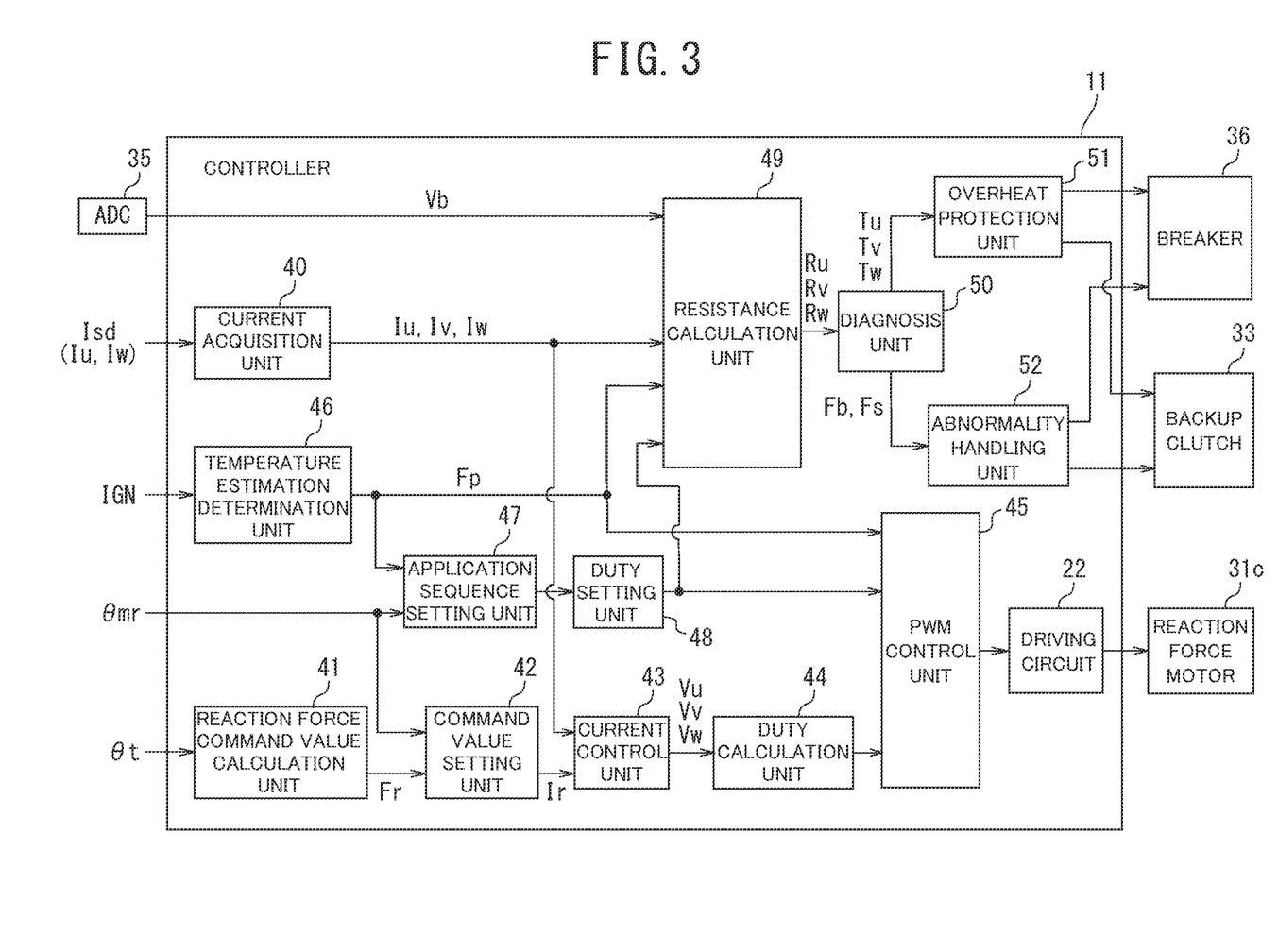
FIG. 3 is a block diagram of a functional configuration example of a controller.

Hereinafter, the functional configuration of the controller 11 will be described with reference to FIG. 3. The controller 11 includes a current acquisition unit 40, a reaction force command value calculation unit 41, a current command value setting unit 42, a current control unit 43, a duty calculation unit 44, a PWM control unit 45, a temperature estimation determination unit 46, an application sequence setting unit 47, a duty setting unit 48, a resistance calculation unit 49, a diagnosis unit 50, an overheat protection unit 51, and an abnormality handling unit 52. In FIG. 3, the duty is referred to as "DUTY".

The current acquisition unit 40 acquires the detected reaction force current Isd from the current sensor 31f. The detected reaction force current Isd may include detected values of the phase current of two phases among the U-phase, the V-phase, and the W-phase. In this example, the detected reaction force current Isd includes detected values of the U-phase current Iu and the W-phase current Iw. The current acquisition unit 40 calculates the V-phase current Iv from the U-phase current Iu and the W-phase current Iw, and outputs the U-phase current Iu, V-phase current Iv, and the W-phase current Iw to the resistance calculation unit 49 and the current control unit 43.

The controller 11 operates at least in a normal mode implemented while the vehicle is in motion, and in an initial diagnostic mode during the diagnostic process. In the normal mode, the reaction force command value calculation unit 41 calculates the steering reaction force command value Fr based on the actual turning angle θt. The current command value setting unit 42 calculates the current command value Ir of the reaction force motor 31c based on the steering reaction force command value Fr and the rotation angle θmr of the reaction force motor 31c. The current control unit 43 calculates the voltage command values Vu, Vv, and Vw by a current feedback control based on the current command value Jr, the U-phase current Iu, V-phase current Iv, and the W-phase current Iw. The duty calculation unit 44, based on the voltage command values Vu, Vv, and Vw calculates the duty of the switching operation for driving the reaction force motor 31c.

In the normal mode, the PWM control unit 45 generates gate voltage of the switching element of the driving circuit 22 based on the duty calculated by the duty calculation unit 44.

Meanwhile, in the initial diagnostic mode, the controller 11 performs determination processing of disconnection and a short circuit of the three phase windings Lu, Lv and Lw of the reaction force motor 31c and estimation processing of the winding temperature. The temperature estimation determination unit 46 outputs an operation mode flag Fp for switching between the normal mode and the initial diagnostic mode of the controller 11. When the value of the operation mode flag Fp is "True", the controller 11 operates in the initial diagnostic mode, and when the value of the operation mode flag Fp is "False", the controller 11 operates in the normal mode.

In the initial diagnostic mode, an ignition signal IGN representing whether the state of the ignition switch is in the on state or the off state. The temperature estimation determination unit 46 refers to a temperature estimation completion flag Ft representing an internal state of the controller 11. The value of the temperature estimation completion flag Ft is "False" from the time the state of the ignition switch changes from the off state to the on state until the estimation processing of the winding temperature is completed, and changes to "True" when the estimation processing is completed.

When the state of the ignition switch changes from the on state to the off state, the temperature estimation determination unit 46 sets the operation mode flag Fp to "True" until the temperature estimation completion flag Ft becomes "True". When the temperature estimation completion flag Ft changes to "True", the temperature estimation determination unit 46 sets the operation mode flag Fp to "False".

In the initial diagnostic mode, the application sequence setting unit 47 sets the order of applying the diagnosing current to the current paths P1 to P3.

Figure 4A:
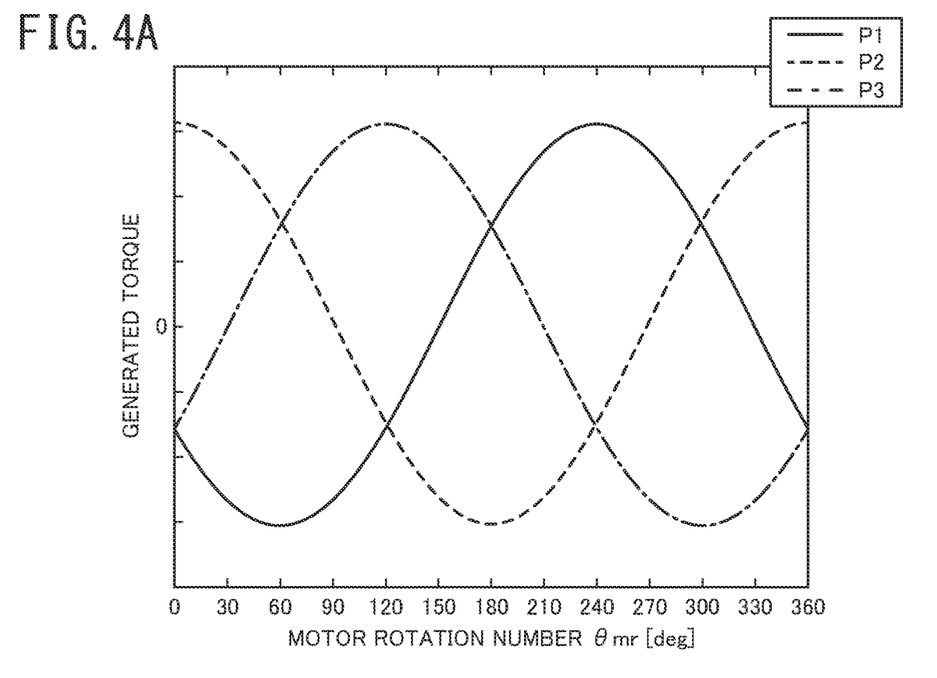
FIG. 4A illustrates a characteristic curve of a rotation angle of the three-phase alternating current motor and generated torque when current is applied on a current path.

FIG. 4A is a characteristic curve representing the relation of the rotation angle θmr and the generated torque generated when constant current is applied to the current paths P1 to P3. The solid line, the broken line, and the alternate long and short dash line represent the characteristic curves of the generated torque when constant current is applied to the current paths P1, P2, and P3. In this example, one of the rotation directions of the reaction force motor 31c is defined as a positive direction, and a rotation angle θmr at which the generated torque becomes maximum (peak) when current is applied to the current path P2 is set as 0 degrees.

As illustrated in FIG. 4A, the characteristic curves of the current paths P1 to P3 deviate from each other by 120 degrees, for example, the waveform of the characteristic curve of the current path P2 from 120 to 240 degrees is equal to the waveform of the characteristic curve of the current path P1 from 0 to 120 degrees. As a result, the characteristics of the generated torque when current is applied to the current paths P1 to P3 switch among the current paths P1 to P3 in a cycle of 120 degrees.

Figure 4B:
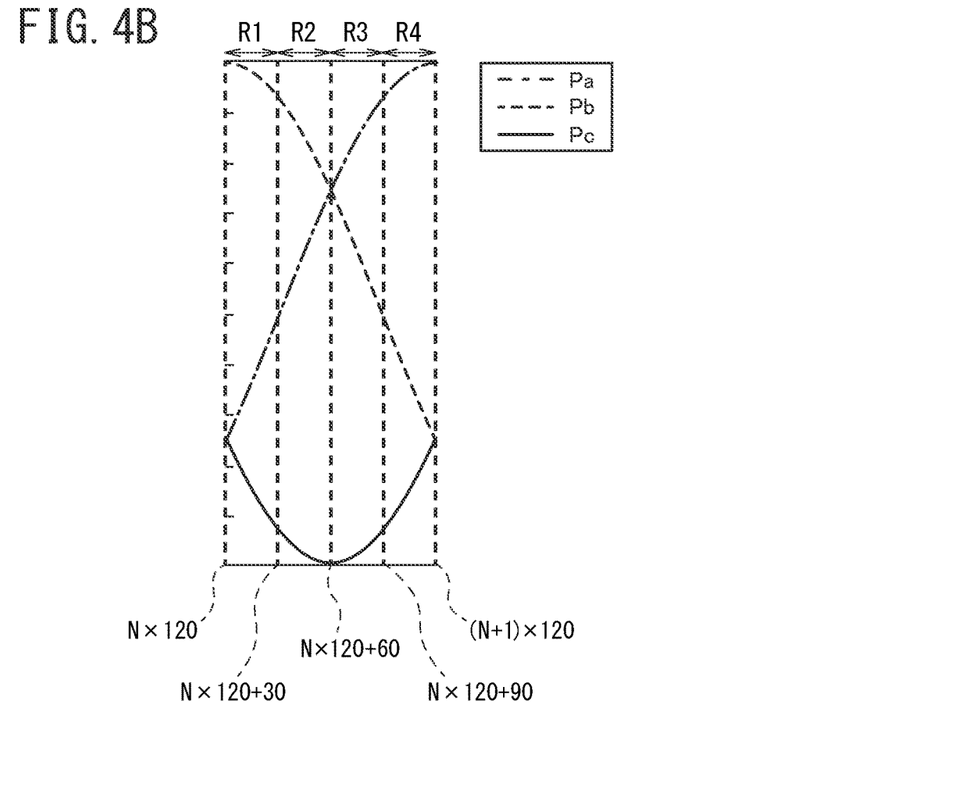
FIG. 4B is an explanatory diagram of an example of setting current paths Pa to Pc in angular ranges R1 to R4 of the three-phase alternating current motor.

Therefore, as illustrated in FIG. 4B, in an angular range of (N×120 to (N+1)×120 degrees) of the rotation angle θmr with a cycle of 120 degrees, each of the three current paths P1 to P3 are assigned as one of the current paths Pa, Pb, and Pc. The alternate long and short dash line, the broken line, and the solid line represent the characteristic curves of the generated torque when constant current is applied to the current paths Pa, Pb, and Pc.

Whether the generated torque when current path Py is energized decreases or increases by a rotation of the reaction force motor 31c by the diagnosing current flowing in one current path Px depends on whether the sign of the generated torque on the characteristic curve of the current path Px is positive or negative at the current rotation angle θmr, and a direction of the inclination of the characteristic curve of the current path Py at the current rotation angle θmr.

In a case where the generated torque of the current path Px is positive, the rotation angle θmr increases because the reaction force motor 31c rotates in the positive direction. Therefore, when the inclination of the current path Py is positive, the generated torque when the current path Py is energized increases, and when the inclination is negative, the generated torque when the current path Py is energized decreases. On the contrary, in a case where the generated torque of the current path Px is negative, when the inclination of the current path Py is positive, the generated torque when the current path Py is energized decreases, and when the inclination is negative, the generated torque when the current path Py is energized increases.

For example, in a range of N×120<rotation angle θmr≤N× 120+30, the generated torque of the current path Pb (broken line) is positive, the inclination of the current path Pa (alternate long and short dash line) is positive, the inclination of the current path Pb is negative, and the inclination of the current path Pc (solid line) is negative. Therefore, when the reaction force motor 31c rotates in the positive direction by applying the current to the current path Pb, the generated torque when the current path Pa is energized increases, and the absolute value of the generated torque decreases. Meanwhile, the generated torque when the current path Pc is energized decreases, and the absolute value of the generated torque increases. The generated torque when the current path Pb is energized decreases.

As illustrated in FIG. 4A, the relation of the sign of the characteristic curve and the inclination changes every 30 degrees.

Therefore, the angular range (N×120 to (N+1)×120 degrees) of the rotation angle θmr with a cycle of 120 degrees is divided to angular ranges R1, R2, R3 and R4 each having a width of 30 degrees. The angular range R1 is a range in which the rotation angle θmr is greater than N×120 and equal to or below N×120+30, the angular range R2 is a range in which the rotation angle θmr is greater than N×120+30 and equal to or below N×120+60, the angular range R3 is a range in which the rotation angle θmr is greater than N×120+60 and equal to or below N×120+90, and the angular range R4 is a range in which the rotation angle θmr is greater than N×120+90 and equal to or below (N+1)×120.

Then, the current paths Pa, Pb, and Pc are set as described below.

The current path Pa is a current path in which the absolute value of the generated torque is the smallest in the angular ranges R1 and R2, and large torque in the positive direction is generated in the angular ranges R3 and R4.

The current path Pb is a current path in which the absolute value of the generated torque is the smallest in the angular ranges R3 and R4, and large torque in the positive direction is generated in the angular ranges R1 and R2.

The current path Pc is a current path in which torque in the negative direction is generated in all of the angular ranges R1 to R4.

The application sequence setting unit 47 sets the sequence of applying the diagnosing current as the order of the current paths Pb, Pa, and Pc when the rotation angle θmr is within the angular range R1. The sequence of applying the diagnosing current is set to the order of the current paths Pc, Pa, and Pb when the rotation angle θmr is within the angular range R2. The sequence of applying the diagnosing current is set to the order of the current paths Pa, Pb, and Pc when the rotation angle θmr is within the angular range R3. The sequence of applying the diagnosing current is set to the order of the current paths Pc, Pb, and Pa when the rotation angle θmr is within the angular range R4.

By setting the application sequence as described above, the diagnosing current can be applied in the second place to a current path with the highest rate of change of the generated torque with respect to the rotation angle θmr at the current rotation angle θmr.

By applying the first diagnosing current, the reaction force motor 31c can be rotated in the direction in which the absolute value of the torque generated when starting the application of the diagnosing current in the second place decreases, moreover, by applying the diagnosing current in the second place, the reaction force motor 31c can be rotated in the direction in which the absolute value of the torque generated when starting the application of the diagnosing current in the third place decreases. For example, when the rotation angle θmr is in an angular range of R1, the generated torque of the current path Pb is positive, the generated torque of the current path Pa is negative, the inclination of the current path Pa is positive, and the inclination of the current path Pc is negative. Therefore, when the diagnosing current is applied to the current path Pb, the absolute value of the torque generated when starting the application of the diagnosing current to the current path Pa in the next place decreases. Also, when the diagnosing current is applied to the current path Pa, the absolute value of the torque generated when starting the application of the diagnosing current to the current path Pc in the next place decreases.

However, as an exception handling, when the rotation angle θmr is proximate to the boundary of the angular ranges R1 and R2, the diagnosing current is applied to the current path Pa having the smallest absolute value of the generated torque, and the diagnosing current is applied to the rest of the current paths Pb and Pc in the second and third places. Since very little torque is generated when the diagnosing current is applied to the current path Pa, the total of the integral value of the generated torque when the diagnosing current is applied to each of the current paths P1 to P3 can be suppressed. For a similar reason, when the rotation angle θmr is proximate to the boundary of the angular ranges R3 and R4, the diagnosing current is applied to the current path Pb having the smallest absolute value of the generated torque in the first place.

At a rotation angle θmr (for example, in the proximity to the boundary of the angular ranges R2 and R3) where generated torque of the two current paths are equal, the diagnosing current is applied first to one of the two current paths in which the reaction force motor 31*c* rotates in a direction where the absolute value of the generated torque generated when the current is applied to the other current path decreases, and the diagnosing current is applied in the second place to the other current path of the two current paths. For example, when the rotation angle θmr is proximate to the boundary of the angular ranges R2 and R3, the sequence of the current paths is set to Pa, Pb, and then Pc.

Refer to FIG. 3. The duty setting unit 48 sets the duty to apply the diagnosing current in the order set by the application sequence setting unit 47.

In the initial diagnostic mode, the PWM control unit 45 generates gate voltage of the switching element of the driving circuit 22 based on the duty set by the duty setting unit 48.

The resistance calculation unit 49 acquires the U-phase current Iu, the V-phase current Iv, and the W-phase current Iw flew in the windings from the current acquisition unit 40 when the diagnosing current was applied to the current paths P1, P2, and P3, and acquires the power voltage Vb applied to the reaction force motor 31*c* from an analog-to-digital converter (ADC) 35. The resistance calculation unit 49 calculates the resistance values Ru, Rv, and Rw of the U-phase winding Lu, the V-phase winding Lv, and the W-phase winding Lw based on the phase current Iu, Iv, and Iw and the power voltage Vb. For example, the resistance calculation unit 49 substitutes the phase current Iu, Iv, and Iw for the current values I1 to I3 in the above equations (1) to (3), respectively, and substitutes the power voltage Vb for the voltage between terminals (Vu–Vv), (Vv–Vw), and (Vw–Vu).

Hereinafter, the U-phase winding Lu, the V-phase winding Lv, and the W-phase winding Lw may be collectively called a "winding L", and the resistance values Ru, Rv, and Rw may be collectively called a "resistance value R".

The diagnosis unit 50 determines that a disconnection has occurred in the winding L when the resistance value R is determined to be greater than a disconnection threshold value Tb, and sets a disconnection detection flag Fb to "True". The "True" of the disconnection detection flag Fb represents a disconnection has been detected, and the "False" represents a disconnection has not been detected.

The diagnosis unit 50 determines that a short circuit has occurred in the winding L when the resistance value R is determined to be smaller than a short circuit threshold value Ts, and sets a short circuit detection flag Fs to "True". The "True" of the short circuit detection flag Fs represents a short circuit has been detected, and "False" represents a short circuit has not been detected.

The diagnosis unit 50 estimates the temperatures Tu, Tv, Tw of the U-phase winding Lu, the V-phase winding Lv, and the W-phase winding Lw based on the resistance value R. The temperatures Tu, Tv, and Tw may be collectively referred to as a "temperature T". When estimating the temperature T, the diagnosis unit 50 sets the temperature estimation completion flag Ft to "True".

The overheat protection unit 51 estimates the temperature T of the winding L in the normal mode based on the history of the phase current flowing in the winding L, using the temperature T of the winding L estimated by the diagnosis unit 50 in the initial diagnostic mode as the initial value. When the estimated temperature T is above the threshold value, the overheat protection unit 51 performs abnormality handling by opening a breaker 36 to separate the power supply from the reaction force motor 31*c*, and connecting the backup clutch. The overheat protection unit 51 may suppress the temperature rise of the winding L by limiting the current command value Ir before performing the abnormality handling.

The abnormality handling unit 52 performs abnormality handling by opening the breaker 36 to separate the power supply from the reaction force motor 31*c* and connecting the backup clutch when one of the disconnection detection flag Fb and the short circuit detection flag Fs is "True".

Figure 5:
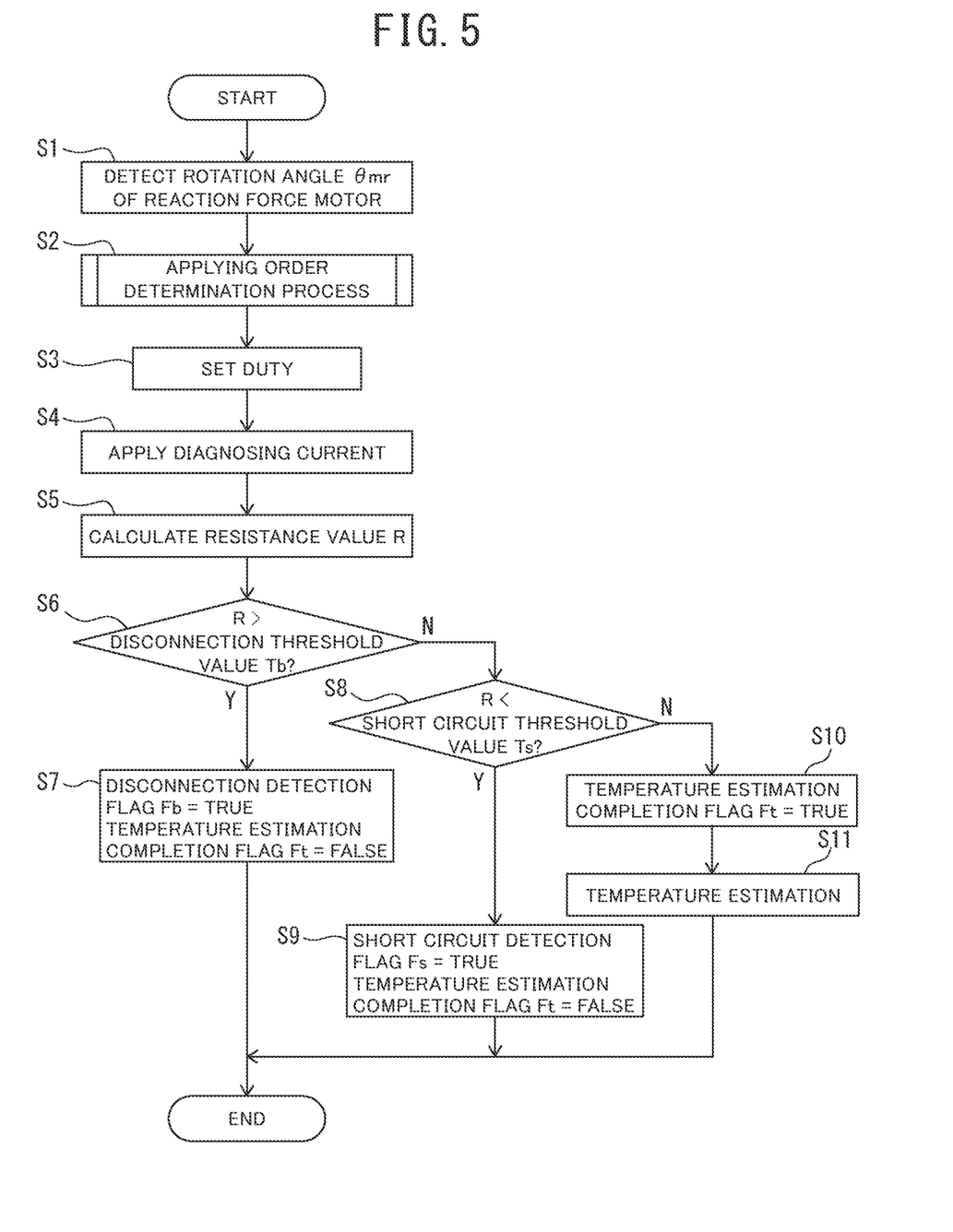
FIG. 5 is a flow chart of an exemplary diagnostic method of the three-phase alternating current motor according to the embodiment.

Referring to FIG. 5, an example of a diagnostic method of the three-phase alternating current motor according to the embodiment will be explained.

In the step S1, the rotation angle θmr of the reaction force motor 31*c* is detected. In the step S2, the applying order determination process for determining the order of applying the diagnosing current to the current paths Pb, Pa, and Pc is performed. The applying order determination process will be described later, referring to FIG. 6. In the step S3, the duty is set to apply the diagnosing current in the order determined in the step S2. In the step S4, the diagnosing current is applied based on the duty set in the step S3. The period of time during which the diagnosing current is applied may be a predetermined extremely short period of time corresponding to the inductance of the winding or the like, enough to accurately detect the current value and the voltage value of the winding.

In the step S5, the resistance R of the winding L is calculated based on the phase current Iu, Iv and Iw and the power voltage Vb when applying the diagnosing current. In the step S6, the resistance R is determined to be greater than the disconnection threshold value Tb or not. When the resistance R is greater than the disconnection threshold value Tb (S6: Y), the process proceeds to the step S7. When the resistance R is equal to or smaller than the disconnection threshold value Tb (S6: N), the process proceeds to the step S8. In the step S7, the disconnection detection flag Fb is set to "True". The temperature estimation completion flag Ft is set to "False".

In the step S8, the resistance R is determined to be smaller than the short circuit threshold value Ts or not. When the resistance R is smaller than the short circuit threshold value Ts (S8: Y), the process proceeds to the step S9. When the resistance R is not smaller than the short circuit threshold value Ts (S8: N), the process proceeds to the step S10. In the step S9, the short circuit detection flag Fs is set to "True". The temperature estimation completion flag Ft is set to "False".

In the step S10, the temperature estimation completion flag Ft is set to "True". In the step S11, the temperature T of the winding L is estimated.

Figure 6:
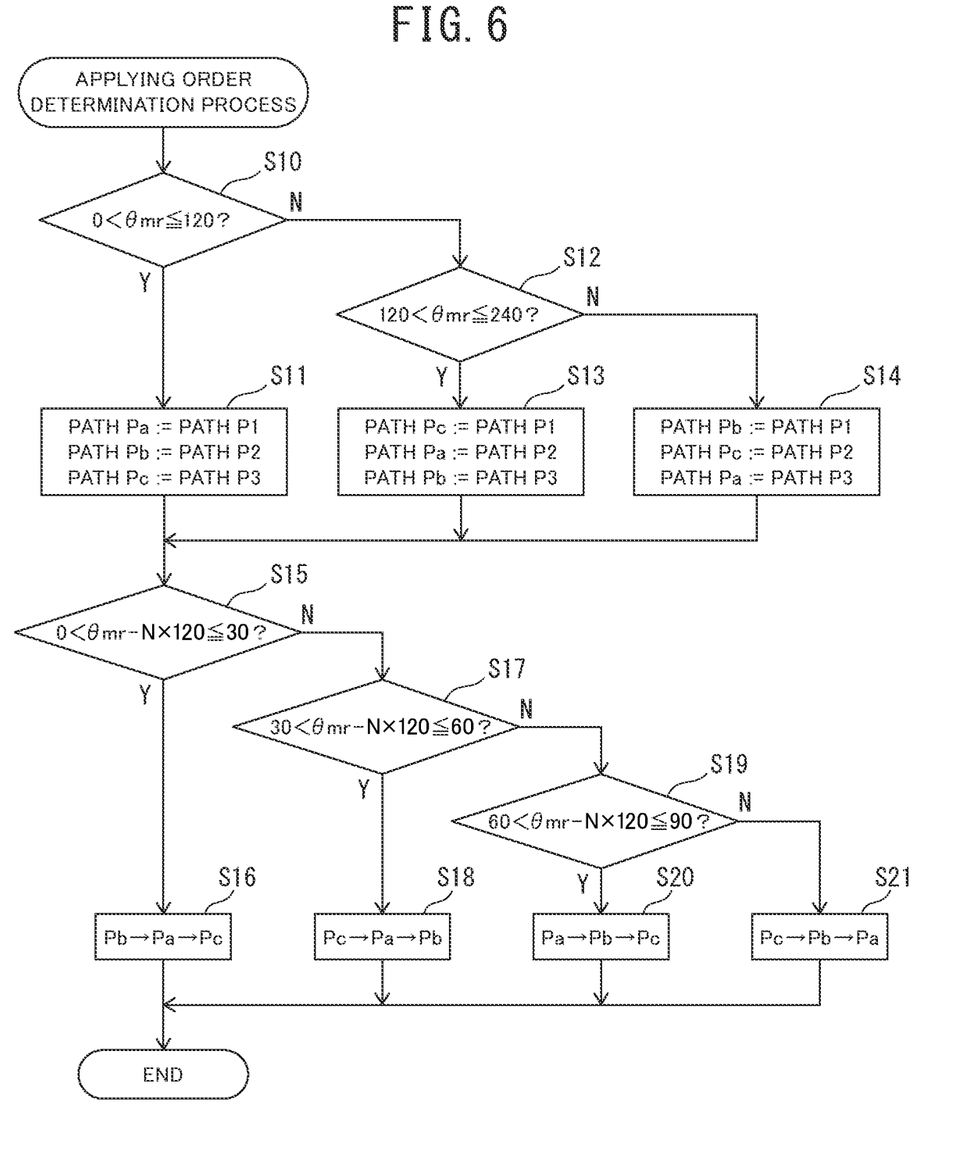
FIG. 6 is a flow chart of an example of an applying order determination process illustrated in FIG. 5.

With reference to FIG. 6, an example of the applying order determination process will be explained.

In the step S10, it is determined whether a conditional expression 0<θmr≤120 is satisfied or not. When the conditional expression 0<θmr≤120 is satisfied (S10: Y), the process proceeds to the step S11. When the conditional expression 0<θmr≤120 is not satisfied (S10: N), the process proceeds to the step S12. In the step S11, the current paths P1, P2, and P3 are set as the current paths Pa, Pb, and Pc, respectively. Then, the process proceeds to the step S15.

In the step S12, it is determined whether a conditional expression 120<θmr≤240 is satisfied or not. When the conditional expression 120<θmr≤240 is satisfied (S12: Y), the process proceeds to the step S13. When the conditional expression 120<θmr≤240 is not satisfied (S12: N), the process proceeds to the step S14. In the step S13, the current paths P1, P2, and P3 are set as the current paths Pc, Pa, and Pb, respectively. Then, the process proceeds to the step S15.

In the step S14, the current paths P1, P2, and P3 are set as the current paths Pb, Pc, and Pa, respectively. Then, the process proceeds to the step S15.

In the step S15, when N is assumed to be an integer equal to or above 0, it is determined whether a conditional expression 0<(θmr−N×120)≤30 is satisfied or not. When the conditional expression 0<(θmrx120)≤30 is satisfied (S15: Y), the process proceeds to the step S16. When the conditional expression 0<(θmr−N×120)≤30 is not satisfied (S15: N), the process proceeds to the step S17. In the step S16, the order in which the diagnosing current is applied is set to the order of the current paths Pb, Pa, and Pc.

In the step S17, it is determined whether a conditional expression 30<(θmr−N×120)≤60 is satisfied or not. When the conditional expression 30<(θmr−N×120)≤60 is satisfied (S17: Y), the process proceeds to the step S18. When the conditional expression 30<(θmr−N×120)≤60 is not satisfied (S17: N), the process proceeds to the step S19. In the step S18, the order in which the diagnosing current is applied is set to the order of the current paths Pc, Pa, and Pb.

In the step S19, it is determined whether a conditional expression 60<(θmr−N×120)≤90 is satisfied or not. When the conditional expression 60<(θmr−N×120)≤90 is satisfied (S19: Y), the process proceeds to the step S20. When the conditional expression 60<(θmr−N×120)≤90 is not satisfied (S19: N), the process proceeds to the step S21. In the step S20, the order in which the diagnosing current is applied is set to the order of the current paths Pa, Pb, and Pc.

In the step S21, the order in which the diagnosing current is applied is set to the order of the current paths Pc, Pb, and Pa.

Effect of the Embodiment (1) The predetermined voltage Vb is applied for the predetermined period of time in the order of the first current path, the second current path, and the third current path of the reaction force motor among the three current paths of the current path P1 in which current flows from the U-phase winding Lu to the V-phase winding Lv via the neutral point Pn, the current path P2 in which current flows from the V-phase winding Lv to the W-phase winding Lw via the neutral point Pn, and the current path P3 in which current flows from the W-phase winding Lw to the U-phase winding Lu via the neutral point Pn, and an abnormality is detected in the U-phase winding Lu, the V-phase winding Lv, and the W-phase winding Lw based on the current values flowing in the first current path, the second current path and the third current path when the predetermined voltage Vb is applied. The second current path is a current path among the current paths P1 to P3 with the highest rate of change of the generated torque with respect to the change in the rotation angle at the current rotation angle θmr of the reaction force motor 31c, and the rotation direction of the reaction force motor 31c when the first current path is energized is the direction in which the absolute value of the generated torque generated when starting the energization of the second current path decreases.

As a result, the absolute value of the generated torque generated when the diagnosing current is applied in the second place can be reduced the most. As a result, the total of the integral value of the generated torque when diagnosing current is applied to each of the current paths P1 to P3 can be efficiently suppressed.

(2) The resistance values Ru Rv and Rw of the U-phase winding Lu, the V-phase winding Lv, and the W-phase winding Lw may be calculated based on the voltage values generated in the first current path, the second current path, and the third current path and the predetermined voltage when the predetermined voltage Vb is applied, and based on the calculated resistance values, an abnormality in the U-phase winding Lu, the V-phase winding Lv, and the W-phase winding Lw may be detected.

As a result, an abnormality detection based on the resistance values Ru, Rv, and Rw of the U-phase winding Lu, the V-phase winding Lv and the W-phase winding Lw becomes possible.

(3) When the calculated resistance values Ru, Rv, and Rw are not in the predetermined range, an abnormality can be determined to have occurred in the U-phase winding Lu, the V-phase winding Lv, and the W-phase winding Lw.

As a result, an abnormality detection based on the resistance values Ru, Rv, and Rw of the U-phase winding Lu, the V-phase winding Lv and the W-phase winding Lw becomes possible.

(4) Based on the calculated resistance values Ru, and Rw, temperature, a disconnection or a short circuit can be detected in the U-phase winding Lu, the V-phase winding Lv and the W-phase winding Lw.

As a result, detection of temperature, a disconnection, or a short circuit of the U-phase winding Lu, the V-phase winding Lv, and the W-phase winding Lw becomes possible.

(5) The second current path is the current path whose absolute value of the generated torque is smallest among the three current paths when energization starts.

As a result, the diagnosing current can be applied in the second place to the current path with the highest rate of change of the generated torque with respect to the change in the rotation angle.

(6) When one rotation direction and the other rotation direction of the reaction force motor 31c are assumed to be the positive direction and the negative direction, and an electric angle of the three-phase alternating current motor at which generated torque becomes a peak value in the positive direction when any one of the three current paths is energized is assumed to be 0 degrees, and when N is assumed to be an integer equal to or above 0, the current path having the greatest torque generation in the positive direction among the three current paths may be selected as the first current path when the electric angle of the reaction force motor 31c is in the range of N×120 to N×120+30 degrees or in the range of N×120+60 to N×120+90 degrees, and the current path having the greatest torque generation in a negative direction among the three current paths may be selected as the first current path when the electric angle of the reaction force motor 31c is in the range of N×120+30 to N×120+60 degrees or in the range of N×120+90 to (N+1)×120 degrees, As a result, the reaction force motor 31c can be rotated in the direction in which the absolute value of the generated torque generated by energizing the second current path decreases when the diagnosing current is applied to the first current path, and the reaction force motor 31c can be rotated in the direction in which the absolute value of the generated torque generated by energizing the third current path decreases when the diagnosing current is applied to the second current path.

REFERENCE SIGNS LIST

31 Steering unit
31a Steering wheel
31b Column shaft
31c Reaction force motor
31e Steering angle sensor
31f Current sensor
31g Motor rotation angle sensor
32 Turning unit
32a Pinion shaft
32b Steering gear
32c Rack gear
32d Steering rack
32e Turning motor
32g Turning angle sensor
32h Current sensor
32i Motor rotation angle sensor
33 Backup clutch
34 Steered wheels
34FL Left front wheel
34FR Right front wheel

The invention claimed is:

1. A diagnostic method of a three-phase alternating current motor having a first phase winding, a second phase winding, and a third phase winding, comprising:
applying predetermined voltage for a predetermined period of time in an order of a first current path, a second current path, and a third current path among three current paths of a current path in which current flows from the first phase winding to the second phase winding via a neutral point, a current path in which current flows from the second phase winding to the third phase winding via a neutral point, and a current path in which current flows from the third phase winding to the first phase winding via a neutral point; and
detecting an abnormality in the first phase winding, the second phase winding, and the third phase winding based on current values flowing in the first current path, the second current path, and the third current path when the predetermined voltage is applied, wherein
the second current path is a current path in which a rate of change of generated torque with respect to change of a rotation angle at a current rotation angle of the three-phase alternating current motor is greatest among the three current paths, and
a rotation direction of the three-phase alternating current motor when the first current path is energized is a direction in which an absolute value of generated torque generated when starting energization of the second current path decreases.

2. A diagnostic method of a three-phase alternating current motor according to claim 1, further comprising:
calculating resistance values of the first phase winding, the second phase winding, and the third phase winding based on voltage values generated in the first current path, the second current path, and the third current path when the predetermined voltage is applied and the predetermined voltage; and
detecting an abnormality in the first phase winding, the second phase winding, and the third phase winding based on the calculated resistance values.

3. The diagnostic method of a three-phase alternating current motor according to claim 2, wherein an abnormality is determined to have occurred in the first phase winding, the second phase winding, and the third phase winding when the calculated resistance value is not within a predetermined range.

4. The diagnostic method of a three-phase alternating current motor according to claim 2 further detecting temperature, disconnection, or a short circuit in the first phase winding, the second phase winding, and the third phase winding based on the calculated resistance value.

5. The diagnostic method of a three-phase alternating current motor according to claim 1, wherein the second current path is a current path whose absolute value of generated torque is smallest among the three current paths when energization starts.

6. The diagnostic method of a three-phase alternating current motor according to claim 5, wherein:
when one rotation direction and another rotation direction of the three-phase alternating current motor are assumed to be a positive direction and a negative direction, and an electric angle of the three-phase alternating current motor at which generated torque becomes a peak value in a positive direction when any one of the three current paths is energized is assumed to be 0 degrees, and when N is assumed to be an integer equal to or above 0,
a current path having a greatest torque generation in a positive direction among the three current paths is selected as the first current path when an electric angle of the three-phase alternating current motor is in a range of N×120 to N×120+30 degrees or in a range of N×120+60 to N×120 to 90 degrees; and
a current path having a greatest torque generation in a negative direction among the three current paths is selected as the first current path when an electric angle of the three-phase alternating current motor is in a range of N×120+30 to N×120+60 degrees or in a range of N×120+90 to (N+1)×120 degrees.

7. The diagnostic method of a three-phase alternating current motor according to claim 1, wherein the three-phase alternating current motor is a reaction force motor configured to apply steering reaction force to a steering of a vehicle.

8. A diagnostic device of a three-phase alternating current motor having a first phase winding, a second phase winding, and a third phase winding, comprising:
a current sensor configured to detect current flowing in at least two current paths among three current paths of a current path in which current flows from the first phase winding to the second phase winding via a neutral point, a current path in which current flows from the second phase winding to the third phase winding via a neutral point, and a current path in which current flows from the third phase winding to the first phase winding via a neutral point; and a controller configured to apply predetermined voltage for a predetermined period of time to a first current path, a second current path, and a third current path in order among the three current paths, and detect an abnormality in the first phase winding, the second phase winding, and the third phase winding based on current values flowing in the first current path, the second current path, and the third current path when the predetermined voltage is applied; wherein the second current path is a current path in which a rate of change of generated torque with respect to change of a rotation angle at a current rotation angle of the three-phase alternating current motor is greatest among the three current paths; and a rotation direction of the three-phase alternating current motor when the first current path is energized is a direction in which an absolute value of generated torque generated when starting energization of the second current path decreases.

\* \* \* \* \*